US008866061B2

(12) United States Patent
Ochi

(10) Patent No.: US 8,866,061 B2
(45) Date of Patent: Oct. 21, 2014

(54) IMAGE CAPTURING UNIT AND IMAGE CAPTURING DEVICE

(75) Inventor: Masahito Ochi, Chiba (JP)

(73) Assignee: Nikon Corporation, Tokyo (JP)

( * ) Notice: Subject to any disclaimer, the term of this patent is extended or adjusted under 35 U.S.C. 154(b) by 200 days.

(21) Appl. No.: 13/424,878

(22) Filed: Mar. 20, 2012

(65) Prior Publication Data

US 2012/0241593 A1 Sep. 27, 2012

(30) Foreign Application Priority Data

Mar. 23, 2011 (JP) .................................. 2011-064533
Mar. 14, 2012 (JP) .................................. 2012-057084

(51) Int. Cl.
*H01L 27/00* (2006.01)
*H01L 27/146* (2006.01)
*H04N 5/217* (2011.01)

(52) U.S. Cl.
CPC ........ *H01L 27/14618* (2013.01); *H04N 5/2171* (2013.01)
USPC ..................... 250/208.1; 250/214.1; 257/433; 257/698

(58) Field of Classification Search
USPC ............ 250/208.1, 239, 216, 214.1; 257/433, 257/698, 774
See application file for complete search history.

(56) References Cited

U.S. PATENT DOCUMENTS

2007/0007459 A1* 1/2007 Shibayama et al. ..... 250/370.11
2011/0154861 A1 6/2011 Kishimoto et al.

FOREIGN PATENT DOCUMENTS

| JP | A-7-231074 | 8/1995 |
| JP | A-11-136586 | 5/1999 |
| JP | A-2005-109903 | 4/2005 |
| JP | A-2008-141037 | 6/2008 |
| JP | A-2008-271487 | 11/2008 |
| JP | A-2010-58989 | 3/2010 |

OTHER PUBLICATIONS

Dec. 4, 2012 Office Action issued in Japanese Patent Application No. 2012-057084 (with translation).

* cited by examiner

*Primary Examiner* — Kevin Pyo
(74) *Attorney, Agent, or Firm* — Oliff PLC

(57) ABSTRACT

An image capturing unit includes: a glass substrate having a first surface and a second surface on an opposite side to the first surface, with a first wiring pattern being provided upon at least the first surface; an image sensor that is electrically connected to the first wiring pattern, and that is mounted upon the first surface of the glass substrate; and a piezoelectric element that is disposed upon the first surface or upon the second surface, and that is electrically connected to the first wiring pattern.

11 Claims, 11 Drawing Sheets

REAR

REAR

REAR

FRONT

REAR

FRONT

FIG.10

| NO. | IMAGE SENSOR | PIEZOELECTRIC ELEMENTS | FPC | EMBODIMENT NO. |
|---|---|---|---|---|
| 1 | REAR | FRONT | FRONT | EMBODIMENT 4 |
| 2 | REAR | FRONT | REAR | EMBODIMENT 1 |
| 3 | REAR | REAR | FRONT | EMBODIMENT 3 |
| 4 | REAR | REAR | REAR | EMBODIMENT 2 |

IMAGE CAPTURING UNIT AND IMAGE CAPTURING DEVICE

INCORPORATION BY REFERENCE

The disclosure of the following priority application is herein incorporated by reference: Japanese Patent Application No. 2011-064533 filed Mar. 23, 2011 and Japanese Patent Application No. 2012-57084 filed Mar. 14, 2012.

BACKGROUND OF THE INVENTION

1. Field of the Invention

The present invention relates to an image capturing unit and an image capturing device.

2. Description of Related Art

A COG (Chip On Glass) unit in which a solid state image sensor such as a CCD sensor or a CMOS sensor or the like is mounted upon a glass substrate can be manufactured by a flip chip implementation technique. Since in a COG the image sensor is mounted directly upon the glass substrate, accordingly it is not necessary to package the image sensor, so that high density implementation is possible. For producing such a COG, a constructional technique is per se known in which the image sensor and a thin electrically conductive layer for application of heat to this image sensor are disposed upon one of the flat surfaces of the glass substrate, and this image sensor and this thin electrically conductive layer are electrically connected to wiring patterns upon the glass substrate (refer to Japanese Laid-Open Patent Publication 2008-141037).

SUMMARY OF THE INVENTION

However since, with the technique of Patent Document #1, the image sensor and the thin electrically conductive layer are provided upon only one of the flat surfaces of the glass substrate, accordingly it is necessary electrically to connect both the image sensor and the thin electrically conductive layer to the wiring patterns upon the glass substrate, and there is the unsatisfactory feature that only one of the surfaces of the glass substrate is used when providing the wiring patterns and the circuit for connection to the wiring patterns.

According to the 1st aspect of the present invention, an image capturing unit comprises: a glass substrate having a first surface and a second surface on an opposite side to the first surface, with a first wiring pattern being provided upon at least the first surface; an image sensor that is electrically connected to the first wiring pattern, and that is mounted upon the first surface of the glass substrate; and a piezoelectric element that is disposed upon the first surface or upon the second surface, and that is electrically connected to the first wiring pattern.

According to the 2nd aspect of the present invention, in the image capturing unit according to the 1st aspect, it is preferred that the piezoelectric element is disposed upon the second surface.

According to the 3rd aspect of the present invention, in the image capturing unit according to the 2nd aspect, it is preferred that a second wiring pattern is provided upon the second surface of the glass substrate; and the piezoelectric element is electrically connected to the second wiring pattern.

According to the 4th aspect of the present invention, in the image capturing unit according to the 3rd aspect, it is preferred that the image capturing unit further comprises a through hole that is provided as drilled through the glass substrate, and that electrically connects the first wiring pattern and the second wiring pattern.

According to the 5th aspect of the present invention, in the image capturing unit according to the 4th aspect, it is preferred that the image sensor and the piezoelectric element are electrically connected to the outside of the image capturing unit via the first wiring pattern, with a single system for connection.

According to the 6th aspect of the present invention, in the image capturing unit according to the 5th aspect, it is preferred that the image capturing unit further comprises a flexible printed circuit that is disposed upon the first surface, and that is electrically connected to the first wiring pattern via a layer of an anisotropic electrically conductive material.

According to the 7th aspect of the present invention, in the image capturing unit according to the 4th aspect, it is preferred that the image sensor and the piezoelectric element are electrically connected to the outside of the image capturing unit via the second wiring pattern, with a single system for connection.

According to the 8th aspect of the present invention, in the image capturing unit according to the 7th aspect, it is preferred that the image capturing unit further comprises a flexible printed circuit that is disposed upon the second surface, and that is electrically connected to the second wiring pattern via a layer of an anisotropic electrically conductive material.

According to the 9th aspect of the present invention, in the image capturing unit according to the 1st aspect, it is preferred that the piezoelectric element is disposed upon the first surface.

According to the 10th aspect of the present invention, in the image capturing unit according to any one of the 1st through 9th aspects, it is preferred that the glass substrate has a property of absorbing infra-red radiation.

According to the 11th aspect of the present invention, in the image capturing unit according to any one of the 1st through 10th aspects, it is preferred that the image capturing unit further comprises: an infra-red cutoff coating that is provided upon the second surface of the glass substrate and that cuts off infra-red radiation; and a ground wiring pattern that is provided upon the second surface of the glass substrate, and that is electrically connected to the infra-red cutoff coating.

According to the 12th aspect of the present invention, an image capturing device comprises an image capturing unit according to any one of the 1st through 11th aspects.

BRIEF DESCRIPTION OF THE DRAWINGS

FIG. 10 is a figure showing the details of the first embodiment through the fourth embodiment, arranged as a table.

DESCRIPTION OF PREFERRED EMBODIMENTS

—The First Embodiment—

A single lens reflex digital camera that is an embodiment of the image capturing device of the present invention will now be explained with reference to the drawings.

Figure 11:
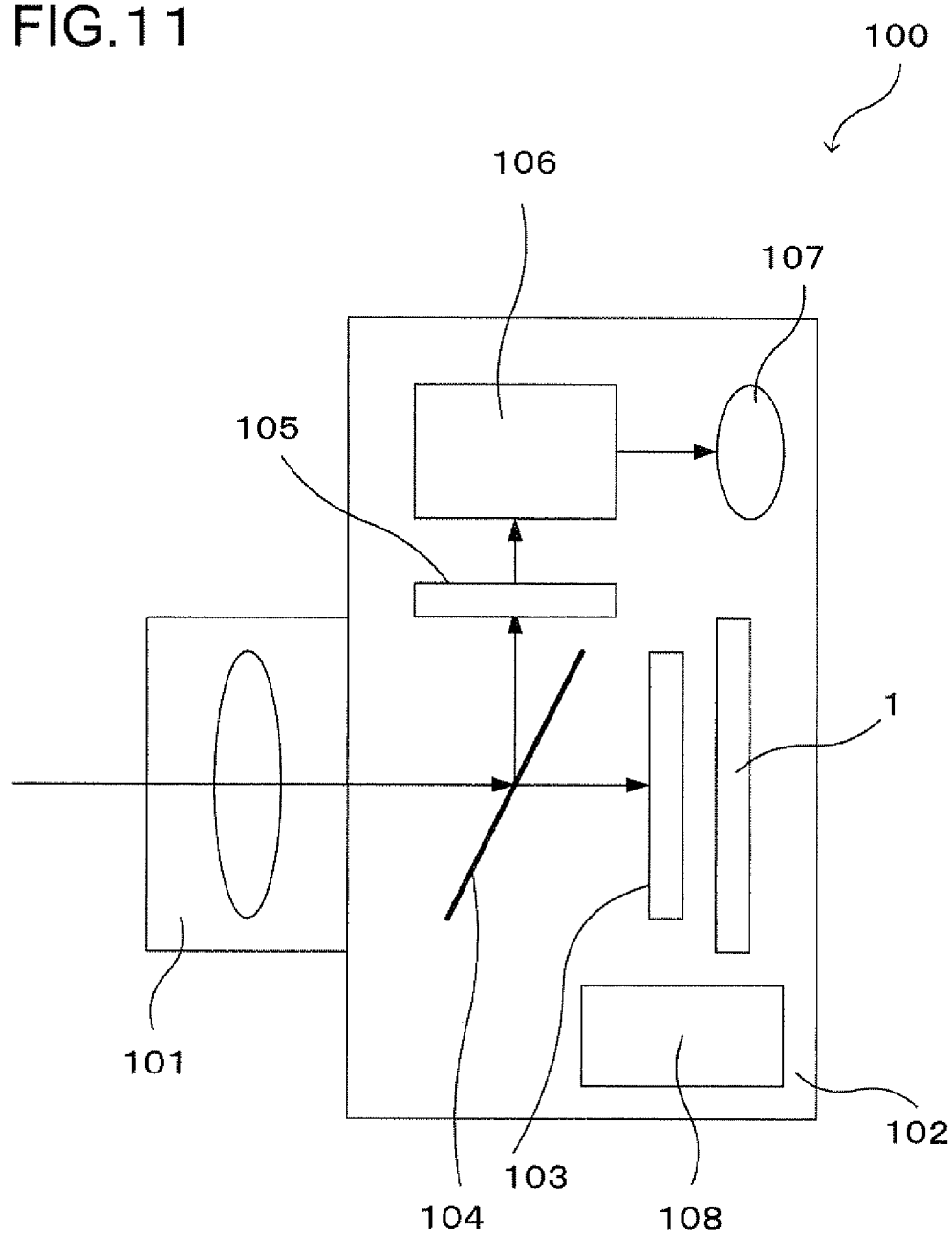
FIG. 11 is a figure showing the structure of a single lens reflex digital camera according to an embodiment of the present invention.

FIG. 11 is a figure showing the general structure of a single lens reflex digital camera 100 (hereinafter termed a "digital camera"). This digital camera 100 includes an interchangeable photographic lens 101 and a camera body 102. The camera body 102 includes an image capturing unit 1, a shutter 103, a quick return mirror 104, a diffusing screen 105, a pentaprism 106, an eyepiece lens 107, a control device 108, and so on.

The quick return mirror 104 is disposed in a tilted configuration in front of the shutter 103 and the image capturing unit 1, and, upon shutter release, this mirror 104 is raised upward and removed from the photographic optical path. When the quick return mirror 104 is thus removed from the photographic optical path, the ray bundle from the photographic subject that has passed through the photographic lens 101 passes through the shutter 103 and arrives at the image capturing unit 1. And, on the basis of this ray bundle from the photographic subject that has arrived at the image capturing unit 1, the photographic unit 1 captures an image of the photographic subject.

On the other hand, in normal circumstances other than during photography, the ray bundle from the photographic subject that has passed through the photographic lens 101 is reflected upwards by the quick return mirror 104, and arrives via the diffusing screen 105, the pentaprism 106, and the eyepiece lens 107 to the eye of the photographer. And the control device 108 performs overall control of the digital camera 100, including control of image capture processing using the image capturing unit 1, control of focus adjustment, exposure control, and so on.

According to this embodiment, the image capturing unit 1 described above has certain specific characteristics. In the following, the details of this image capturing unit 1 will be explained. In the image capturing unit 1 of this embodiment, an image sensor and certain other components are provided on a glass substrate according to a COG (Chip On Glass) implementation technique and a flip chip implementation technique. In other words, this image capturing unit 1 is an image capturing unit of the COG type.

Figure 1:
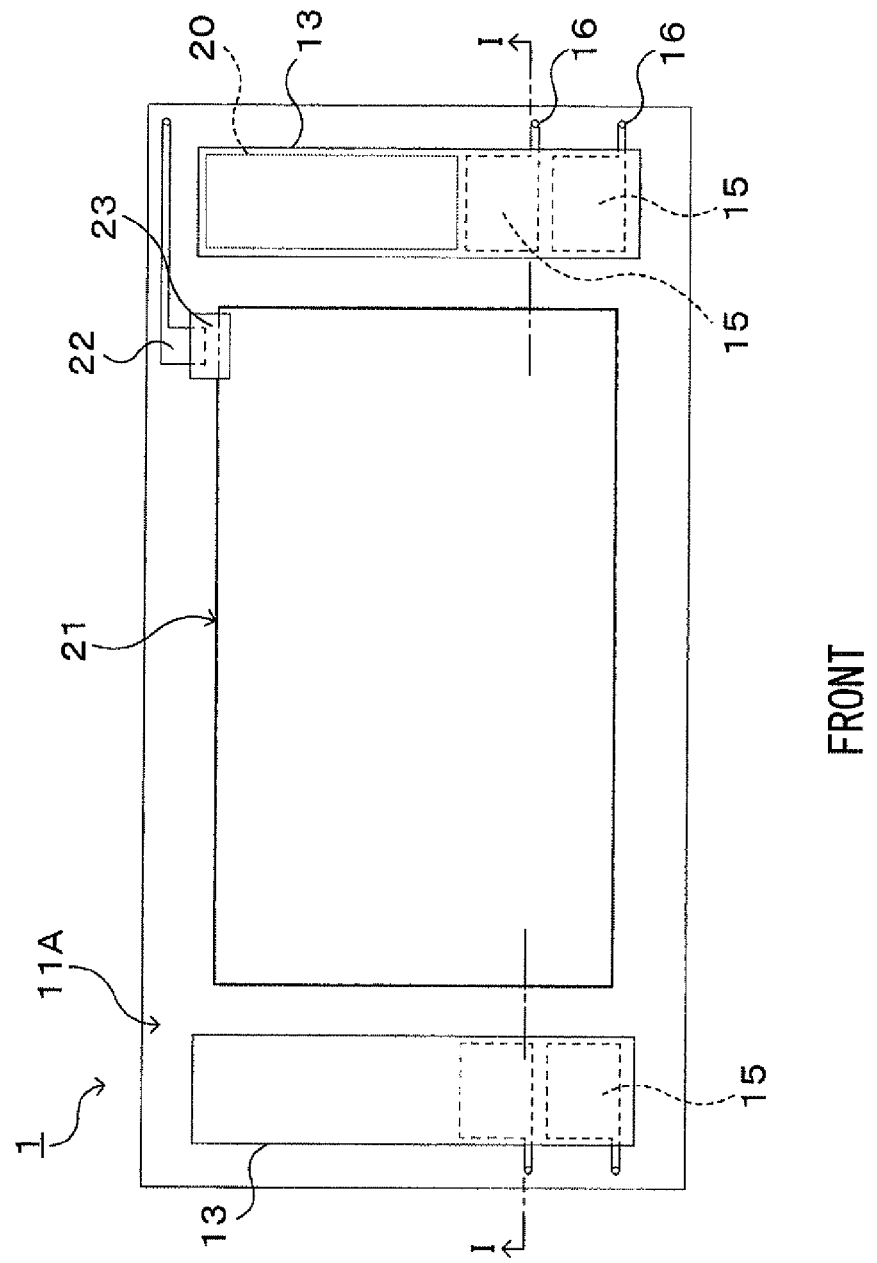
FIG. 1 is a plan view schematically showing the structure of an image capturing unit according to a first embodiment of the present invention.

As shown in FIG. 1, the image capturing unit 1 includes a glass substrate 11 that has the property of absorbing infra-red radiation hereinafter abbreviated as the "infra-red radiation absorbent glass 11"), an image sensor 12 (refer to FIG. 2) that is provided upon the rear surface 11B of the infra-red radiation absorbent glass 11, and two piezoelectric elements 13 that are provided upon the front surface 11A of the infra-red radiation absorbent glass 11. It should be understood that the front surface 11A of the infra-red radiation absorbent glass 11 is its surface upon which light is incident.

The infra-red radiation absorbent glass 11 is a type of glass to which a minute amount of nickel or cobalt or the like has been added, and has the characteristic of absorbing infra-red radiation, or, to put it in another manner, of cutting out infra-red light rays, while allowing passage of light rays other than infra-red radiation, i.e. light of other wavelengths.

Figure 2:
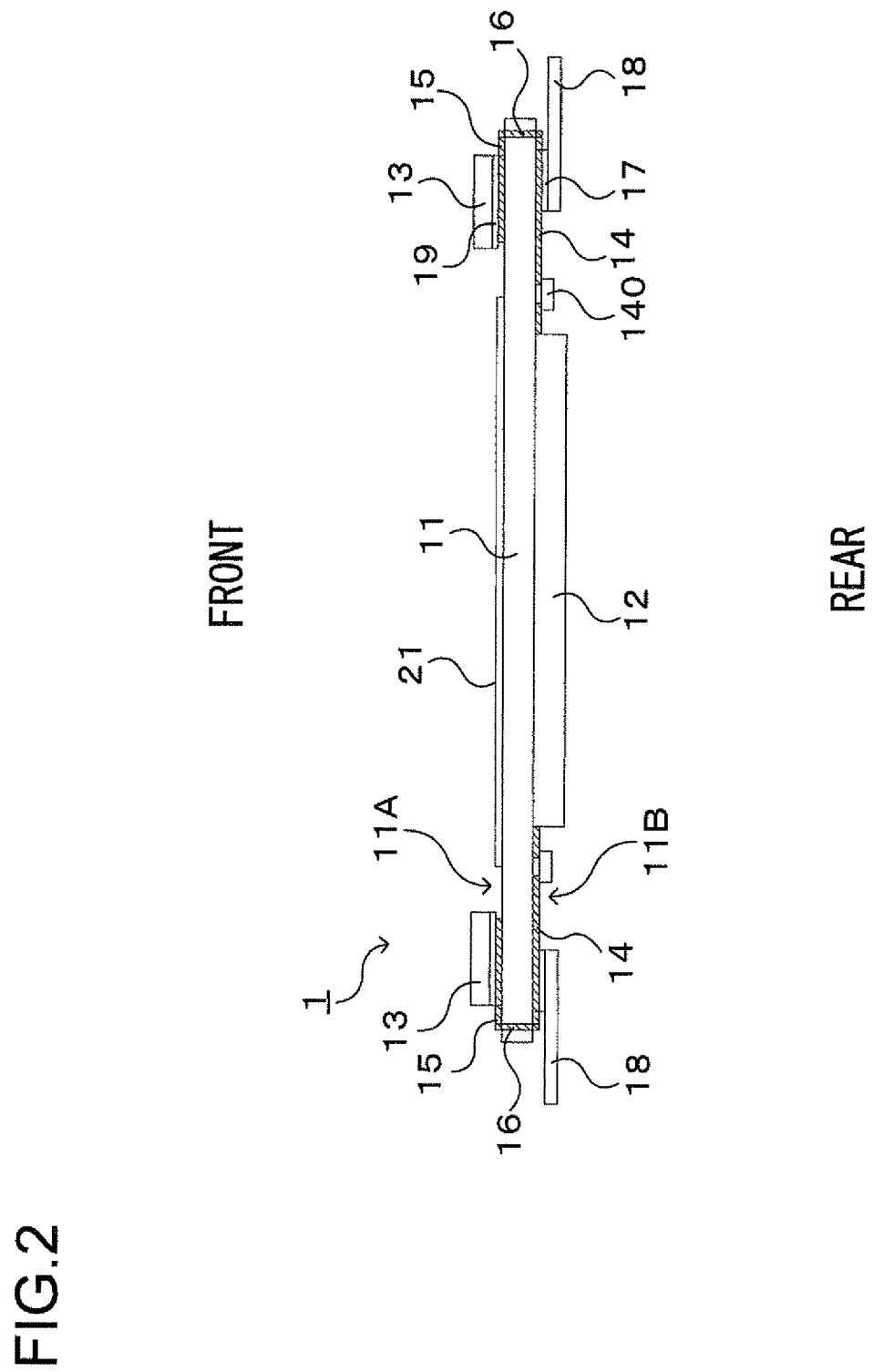
FIG. 2 is a sectional view along lines I-I in FIG. 1, schematically showing the structure of this image capturing unit according to the first embodiment of the present invention.
Figure 3:
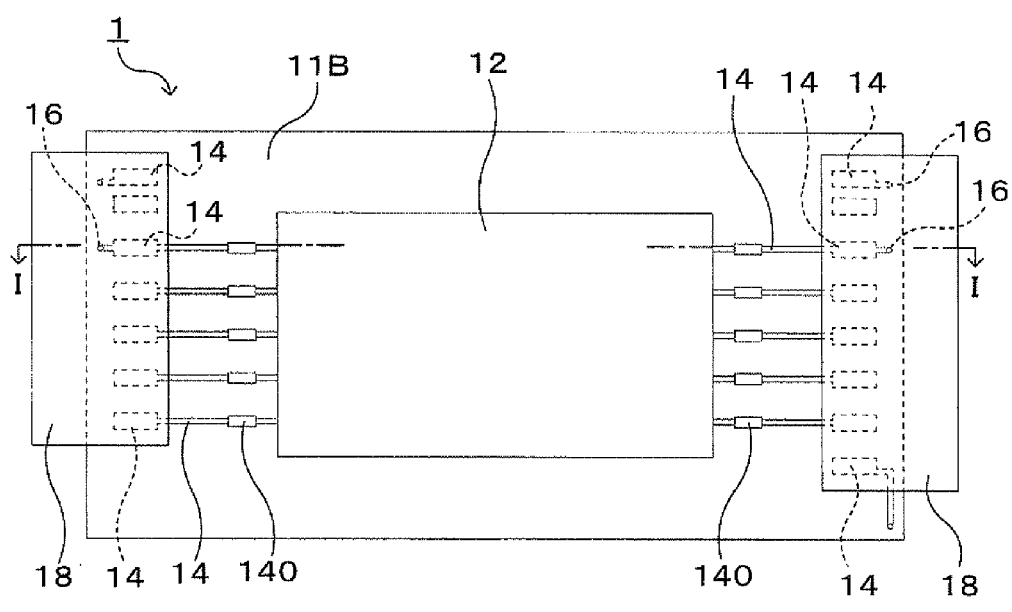
FIG. 3 is a view schematically showing the structure of this image capturing unit according to the first embodiment of the present invention, as seen from below.

As shown in FIGS. 2 and 3, the image sensor 12 is mounted upon the rear surface 11B of the infra-red radiation absorbent glass 11 at its central region, so that its light reception surface faces the infra-red radiation absorbent glass 11. The image sensor 12 includes a CCD sensor or a CMOS sensor or the like, and photoelectrically converts an optical image that is formed upon its light reception surface into an electrical signal that it then outputs.

As shown in FIGS. 1 and 2, the two piezoelectric elements 13 are disposed upon the front surface 11A of the infra-red radiation absorbent glass 11, with one of these piezoelectric elements 13 being disposed upon the left edge of the front surface 11A of the infra-red radiation absorbent glass 11 and a similar one being disposed upon the right edge thereof. Each of these piezoelectric elements 13 is made by gluing two electrodes at opposite ends of a piezoelectric element that is made from a ceramic or the like, and generates vibration, i.e. repeated deformation, due to application of an AC voltage between these electrodes. Accordingly, it is possible to apply vibration or a deforming force to the body to which these piezoelectric elements 13 are adhered.

A plurality of wiring patterns 14 are formed upon the rear surface 11B of this infra-red radiation absorbent glass 11, and the plurality of wiring patterns are formed upon the both left and right edges of the rear surface 11B of the infra-red radiation absorbent glass 11 similarly. The image sensor 12 is connected to these plurality of wiring patterns at the both edges.

Moreover, electrode patterns 15 are formed on the left and right edges of the front surface 11A of the infra-red radiation absorbent glass 11, with this pair of electrode patterns 15 being disposed in positions where they do not shield the light reception surface of the image sensor 12 from incident light. The piezoelectric elements 13 are connected to these electrode patterns 15. It should be understood that these electrode patterns may also be considered as being wiring patterns.

Referring to FIG. 2, the surfaces of the wiring patterns 14 are electrically connected to connection FPCs (Flexible Printed Circuits) 18 via layers 17 of anisotropic electrically conductive material. These layers 17 of anisotropic electrically conductive material are made from a material in which electrically conductive particles are dispersed within an insulating paste that has adhesive force or a film, and, due to the application of heat and pressure, they exhibit electrical anisotropy, being conductive in the thickness direction (the direction in which pressure is applied) while being insulating in planes parallel to their surfaces. The wiring patterns 14 are each electrically connected to terminals of the image sensor 12 via electrical components such as, for example, bypass capacitors 140 or the like. The connection FPCs 18 are flexible printed circuits.

In a similar manner, the electrode patterns 15 are also electrically connected to the piezoelectric elements 13 via layers 19 of anisotropic electrically conductive material. It should be understood that an adhesive layer 20 is provided upon the portion of the front surface 1A of the infra-red radiation absorbent glass 11 of FIG. 1 on which the electrode patterns 15 are not disposed, in order to cancel out the differences in level due to the thickness of the electrode patterns 15 and in order to increase the adhesive force.

The wiring patterns 14 and the electrode patterns 15 are electrically connected together via electrically conducting through holes 16 that are provided by being drilled between the front surface and the rear surface of the infra-red radiation absorbent glass 11.

The piezoelectric elements 13, the electrode patterns 15, the wiring patterns 14, and the connection FPCs 18 described above are provided in pairs, on the left and the right edge of the infra-red radiation absorbent glass 11. The positions and the sizes of these piezoelectric elements 13, electrode patterns 15, wiring patterns 14, and connection FPCs 18 are determined so that they do not shield any portions of the light reception surface of the image sensor 12 from light that is incident thereupon.

Moreover, a UV/IR cutoff coating layer 21 is formed at the central region of the front surface 11A of the infra-red radiation absorbent glass 11, and a GND pattern (ground pattern) 22 is formed at the upper right (in FIG. 1) of the front surface 11A of the infra-red radiation absorbent glass 11. This UV/IR cutoff coating layer 21 is made of several layers, so that it cuts off ultraviolet light and infra-red light while allowing passage of light in the intermediate wavelength range between ultraviolet light and infra-red light. The UV/IR cutoff coating layer 21 has the characteristic that its transmittivity curve changes steeply in the wavelength region at the boundary between passing and absorbing infra-red light, and thereby, together with the infra-red radiation absorbent glass 11, the characteristic for cutting off infra-red light is enhanced.

Electrical continuity between the UV/IR cutoff coating layer 21 and the GND pattern 22 is maintained by a piece of electrically conductive tape 23. Accordingly, electric charge that has electrified the surface of the UV/IR cutoff coating layer 21 can be discharged by the GND pattern 22, so that this surface is kept at earth potential. Moreover, electric charge that has electrified the front surface 11A of the infra-red radiation absorbent glass 11 can also be discharged by this GND pattern 22. Due to the beneficial effects of this action for electrical discharge, it is possible to avoid dust or waste material adhering to the surface of the infra-red radiation absorbent glass 11.

The operation of this image capturing unit 1 having the structure described above will now be explained in the following.

When the power supply (not shown) is turned on, the electric power from the power supply is supplied to the wiring patterns 14 via the connection FPCs 18, and the operation of the image sensor 12 starts. And, after the image capturing operation by the image sensor has been completed, when a driving signal for the piezoelectric elements 13 is supplied to the electrode patterns 15 due to the operation of an actuation switch not shown in the figures, the piezoelectric elements 13 vibrate. Due to this vibration of the piezoelectric elements 13, dust or waste that has adhered to the surface of the infra-red radiation absorbent glass 11 and to the UV/IR cutoff coating layer 21 is shaken and falls off. It is easy for material adhering to the surfaces of the infra-red radiation absorbent glass 11 and of the UV/IR cutoff coating layer 21 to be eliminated in this manner, since any electrical charge thereupon is discharged by the GND pattern 22.

The image capturing unit 1 of this embodiment provides the following beneficial operational effects.

(1) It is possible to effectively use both the sides of the infra-red radiation absorbent glass 11 as wiring space, i.e. to effectively use both its front surface and its rear surface.

(2) By using infra-red radiation absorbent glass 11 as the glass substrate, it is possible to make the use of a cover glass unnecessary, so that it is possible to reduce the number of reflecting surfaces upon the optical path along which light is incident.

(3) Since the wiring patterns 14 and the electrode patterns 15 are electrically connected together via the electrically conductive through holes 16, and since these wiring patterns 14 for the electrode patterns 15 and the other wiring patterns 14 for the image sensor 12 are both electrically connected to the connection FPCs 18, accordingly it is possible to manage with a single system for supplying electrical energy from the power supply and the driving signal to the image sensor 12 and to the piezoelectric elements 13. In addition, signal lines from the image sensor 12 also can be included therein to be managed with a single system. In other words, the image sensor 12 and the piezoelectric element 13 are electrically connected to the outside (i.e. the control device 108 and the power supply (not shown)) of the image capturing unit 1 via the wiring patterns 14, with a single system for connection to the outside of the image capturing unit 1. And the wiring for the image sensor 12 and the wiring for the piezoelectric elements 13 is unified, so that no FPCs are required for the piezoelectric elements 13. Due to this, the wiring is made easier, and it is possible to attain reduction of the space occupied, so that the device is made more compact and lighter, and its cost is reduced.

(4) By using both the infra-red radiation absorbent glass 11 and the UV/IR cutoff coating layer 21 together, it is possible to enhance the performance for cutting off infra-red light.

(5) Since, due to the GND pattern 22, it is possible to eliminate charge from the UV/IR cutoff coating layer 21 if it should become electrified, accordingly it is possible to eliminate dust or waste that has adhered to the coating layer 21 in a simple and easy manner.

—The Second Embodiment—

Figure 4:
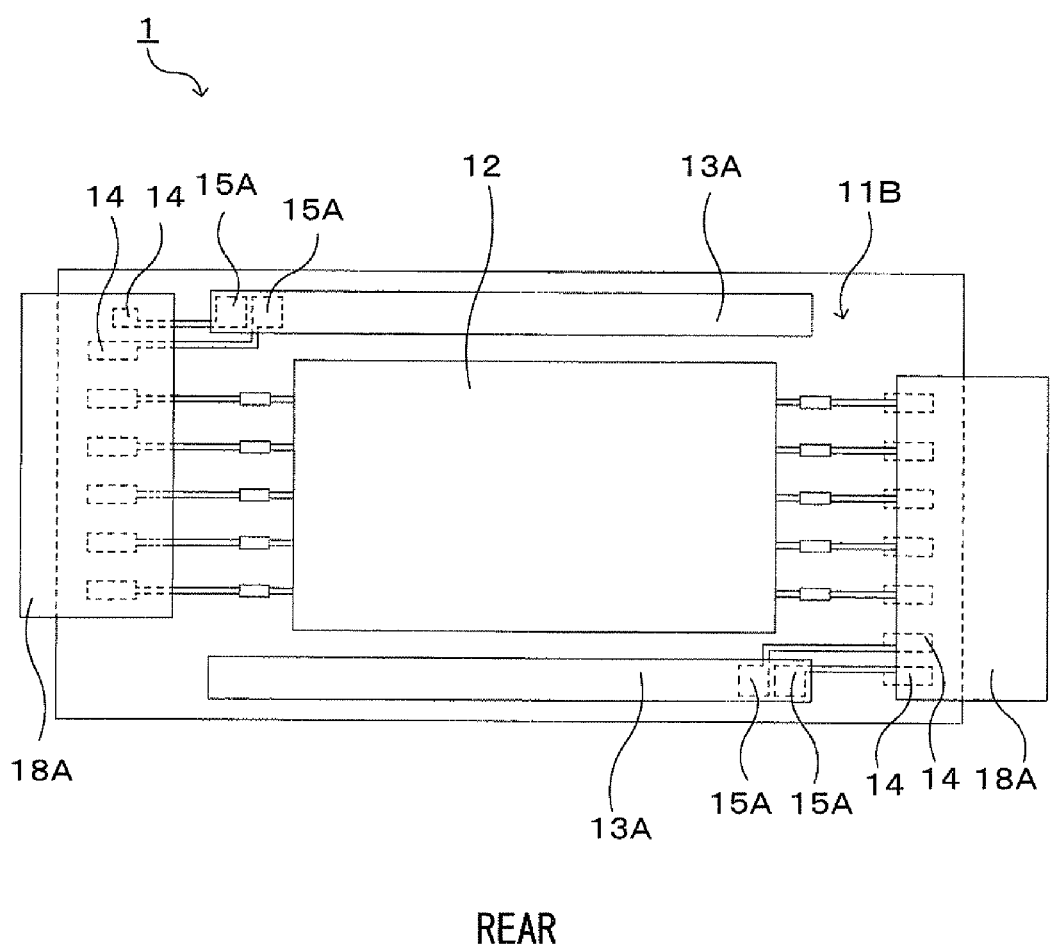
FIG. 4 is a view schematically showing the structure of an image capturing unit according to a second embodiment of the present invention, as seen from below.

In the first embodiment, an example was shown in which the piezoelectric elements 13 were provided upon the front surface 11A of the infra-red radiation absorbent glass 11. However, it would also be acceptable to arrange to provide the piezoelectric elements on the rear surface 11B of the infra-red radiation absorbent glass 11. FIG. 4 is a view schematically showing the structure of an image capturing unit 1 according to a second embodiment of the present invention, as seen from below (i.e. from the rear). This FIG. 4 corresponds to FIG. 3 for the first embodiment. In the following, the features of difference from the first embodiment will be explained with reference to this FIG. 4. The other details may be found by reference to the details of the first embodiment.

Electrode patterns 15A are provided at the upper and lower edges of the rear surface 11B of the infra-red radiation absorbent glass 11, with these electrode patterns 15A being disposed in positions in which they do not shield (i.e. do not shadow) the light reception surface of the image sensor 12. Piezoelectric elements 13A are connected to these electrode patterns 15A. And, on the rear surface 11B of the infra-red radiation absorbent glass 11, the electrode patterns 15A are connected to connection FPCs 18A via wiring patterns 14.

The piezoelectric elements 13A are disposed along the upper and lower edges of the infra-red radiation absorbent glass 11. And the positions and the sizes of these piezoelectric elements 13A, electrode patterns 15A, wiring patterns 14, and connection FPCs 18A are determined so that they do not shield any portion of the light reception surface of the image sensor 12 from light that is incident thereupon, in a similar manner to the case with the first embodiment.

In the first embodiment, it was possible to effectively use both the front surface and the rear surface of the infra-red radiation absorbent glass 11 as wiring space. In the second embodiment, according to the structure described above, it is possible to effectively use the rear surface of the infra-red radiation absorbent glass 11 as wiring space.

Other beneficial effects are available with this second embodiment as in the case of the first embodiment.

—The Third Embodiment—

In the first embodiment, an example was shown in which the piezoelectric elements 13 were provided upon the front surface 11A of the infra-red radiation absorbent glass 11, while the connection FPCs 18 were provided upon the rear surface 11B of the infra-red radiation absorbent glass 11. However, in a third embodiment, an example is shown in which the piezoelectric elements are provided upon the rear surface 11B of the infra-red radiation absorbent glass 11, while the connection FPCs are provided upon the front surface 11A of the infra-red radiation absorbent glass 11. In the following the features of difference from the first embodiment will be explained with reference to FIGS. 5, 6, and 7. The other details may be found by reference to the details of the first embodiment.

Figure 5:
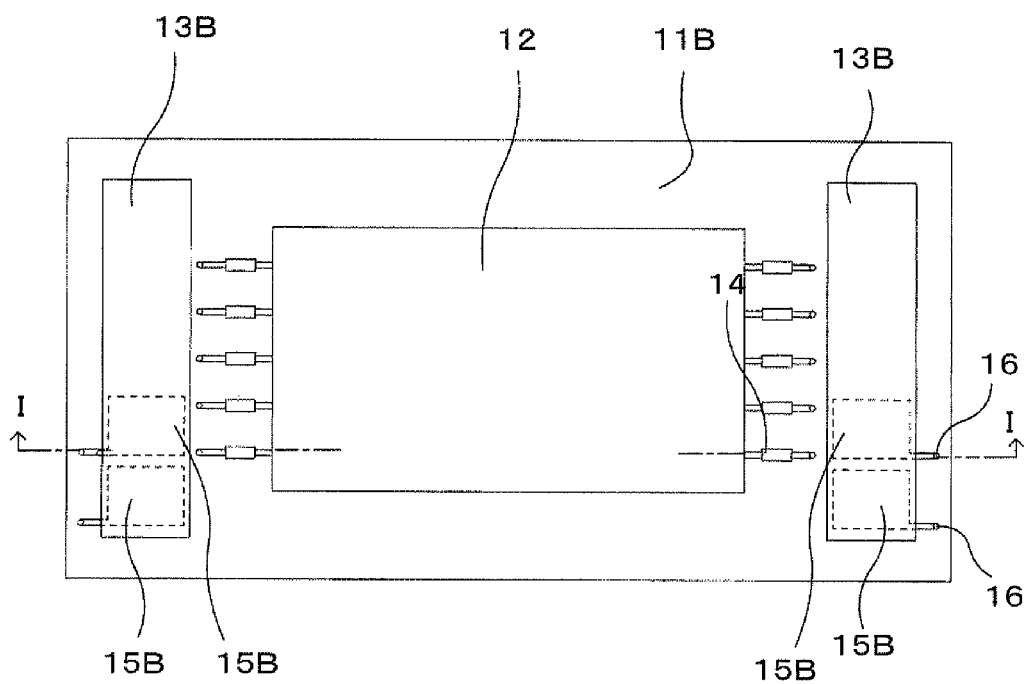
FIG. 5 is a view schematically showing the structure of an image capturing unit according to a third embodiment of the present invention, as seen from below.
Figure 6:
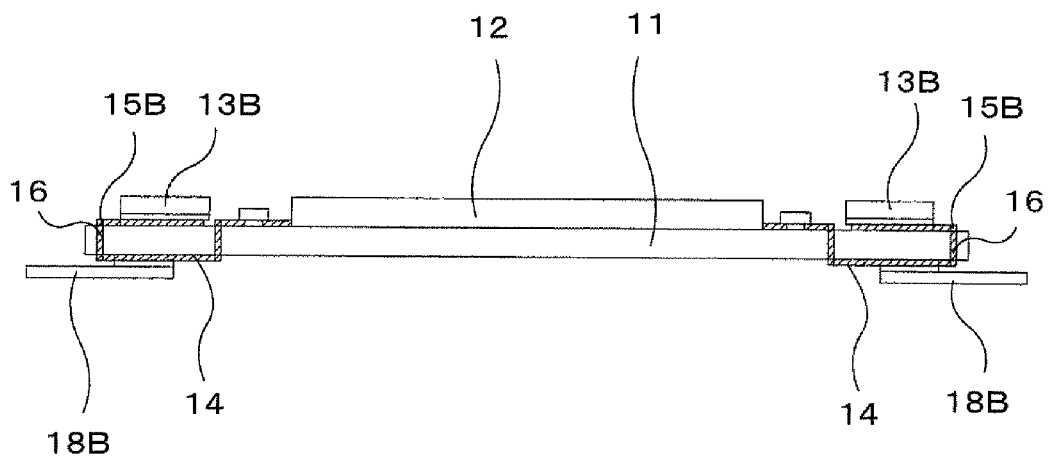
FIG. 6 is a sectional view along lines I-I in FIG. 5, schematically showing the structure of this image capturing unit according to the third embodiment of the present invention.
Figure 7:
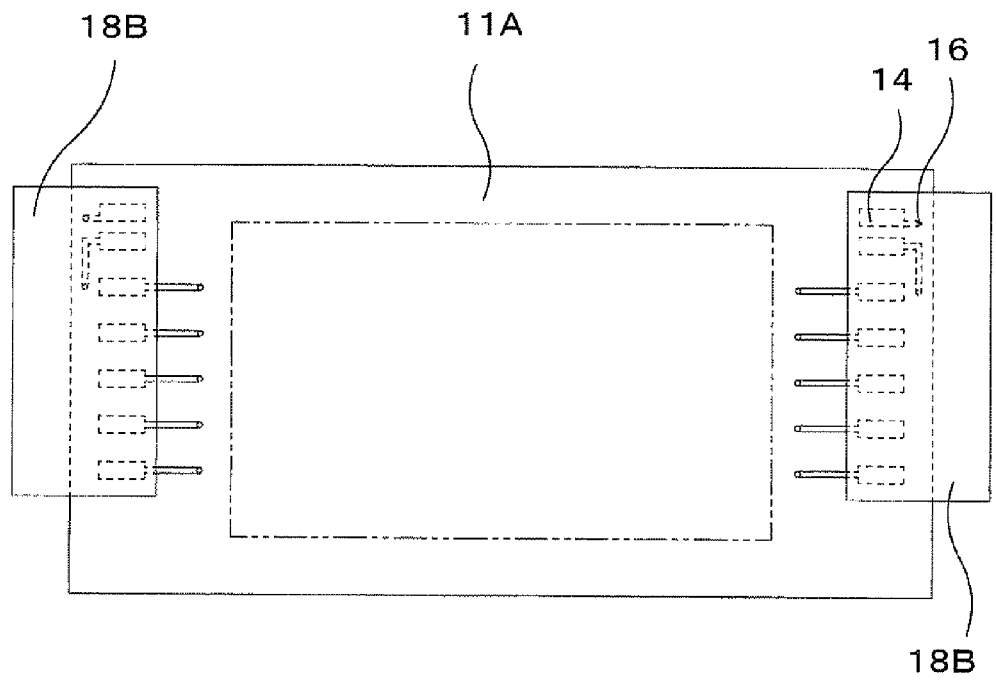
FIG. 7 is a plan view schematically showing the structure of this image capturing unit according to the third embodiment of the present invention.

FIG. 5 is a view schematically showing the structure of an image capturing unit according to this third embodiment, as seen from below (i.e. from the rear). And FIG. 6 is a sectional view along lines I-I in FIG. 5, schematically showing the structure of this image capturing unit according to this third embodiment. Moreover, FIG. 7 is a plan view (i.e. a front view) schematically showing the structure of this image capturing unit according to this third embodiment.

As shown in FIGS. 5 and 6, electrode patterns 15B are formed upon the left and right edges of the rear surface 11B of the infra-red radiation absorbent glass 11, and these electrode patterns 15B are connected to piezoelectric elements 13B. And, as shown in FIGS. 6 and 7, connection FPCs 18B are provided upon the left and right edges of the front surface 11A of the infra-red radiation absorbent glass 11. These electrode patterns 15B and these connection FPCs 18B are electrically connected together via through holes 16 and wiring patterns 14.

The piezoelectric elements 13B, the electrode patterns 15B, the wiring patterns 14, and the connection FPCs 18B described above are disposed along the left and right edges of the infra-red radiation absorbent glass 11. And the positions and the sizes of these piezoelectric elements 13B, electrode patterns 15B, wiring patterns 14, and connection FPCs 18B are determined so that they do not shield any portion of the light reception surface of the image sensor 12 from light that is incident thereupon.

According to the structure described above, the same beneficial effects are available with this third embodiment as in the case of the first embodiment.

—The Fourth Embodiment—

In the first embodiment, an example was shown in which the connection FPCs 18 were provided upon the rear surface 11B of the infra-red radiation absorbent glass 11. However, in a fourth embodiment, an example is shown in which these connection FPCs are provided upon the front surface 11.A of the infra-red radiation absorbent glass 11. In the following the features of difference from the first embodiment will be explained with reference to FIGS. 8 and 9. The other details may be found by reference to the details of the first embodiment.

Figure 8:
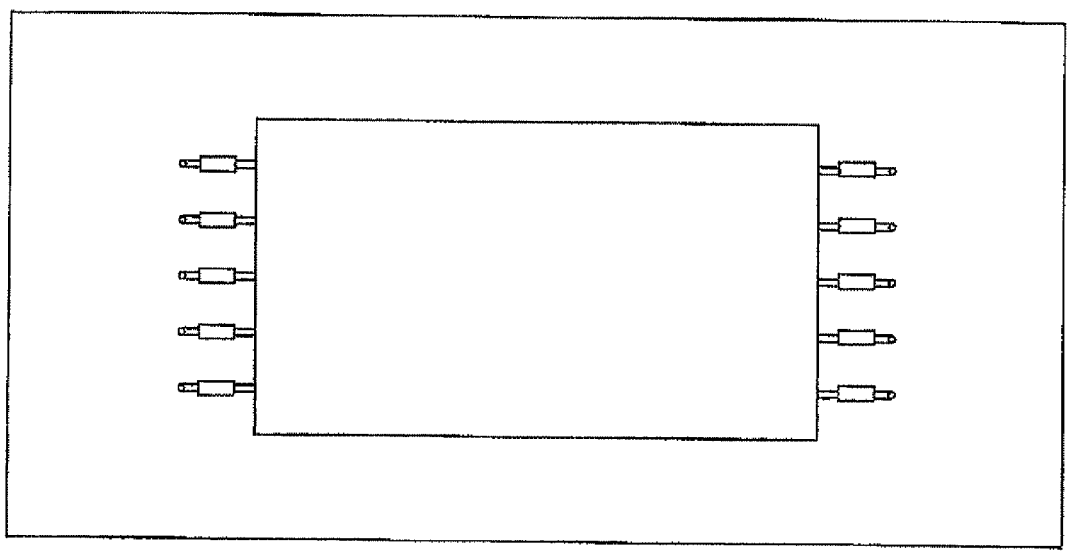
FIG. 8 is a view schematically showing the structure of an image capturing unit according to a fourth embodiment of the present invention, as seen from below.

FIG. 8 is a view schematically showing the structure of an image capturing unit according to this fourth embodiment, as seen from below (i.e. from the rear). And FIG. 9 is a plan view (i.e. a front view) schematically showing the structure of this image capturing unit according to the fourth embodiment.

Figure 9:
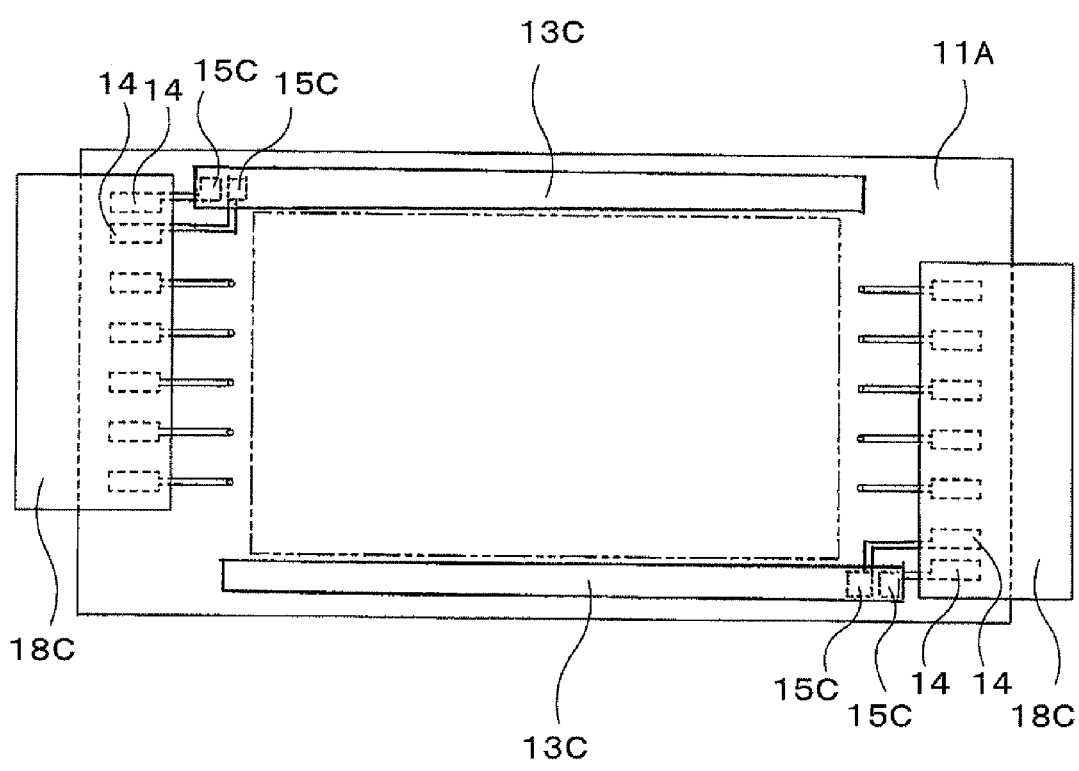
FIG. 9 is a plan view schematically showing the structure of this image capturing unit according to the fourth embodiment of the present invention.

As shown in FIG. 9, electrode patterns 15C are formed at the upper and lower edges of the infra-red radiation absorbent glass 11, and piezoelectric elements 13C are connected to these electrode patterns 15C. Moreover, connection FPCs 18C are provided upon the left and right edges of the infrared radiation absorbent glass 11. These electrode patterns 15C and connection FPCs 18C are electrically connected together via wiring patterns 14.

The piezoelectric elements 13C and the electrode patterns 15C described above are disposed along the upper and lower edges of the infra-red radiation absorbent glass 11, while the connection FPCs 18C are disposed along the left and right edges of the infra-red radiation absorbent glass 11. The electrode patterns 15C and the connection FPCs 18C are electrically connected together via the wiring patterns 14. And the positions and the sizes of these piezoelectric elements 13C, electrode patterns 15C, wiring patterns 14, and connection FPCs 18C are determined so that they do not shield any portion of the light reception surface of the image sensor 12 from light that is incident thereupon.

According to the structure described above, the same beneficial effects are available with this fourth embodiment as in the case of the first embodiment.

FIG. 10 is a figure in the form of a table showing, for each of the first embodiment through the fourth embodiment described above, whether its image sensor, piezoelectric elements, and FPCs are provided upon the front surface or upon the rear surface of the infra-red radiation absorbent glass 11. In the above description of the embodiments, the expressions "front" and "rear" are used in reference to the two surfaces infra-red radiation absorbent glass 11. This is because, when the image capturing unit 1 is mounted to the digital camera 100, its surface towards the photographic subject is the one that becomes its "front", while its opposite surface, in other words its surface upon which the image sensor 12 is disposed, is the one that becomes its "rear". It would, however, also be acceptable simply to refer to a "first surface" and to a "second surface".

Now, variants of this embodiment will be explained in the following. While, in the embodiments described above, both the infra-red radiation absorbent glass 11 and also the UV/IR cutoff coating layer 21 were used together, it would also be acceptable to use only one of these. In other words, it would be acceptable to use the UV/IR cutoff coating layer 21 in combination with a normal glass substrate that does not cut off infra-red radiation, or alternatively to use only the infra-red radiation absorbent glass 11 and to omit the UV/IR cutoff coating layer 21.

It would also be acceptable to provide the UV/IR cutoff coating layer 21 upon the rear surface of the infra-red radiation absorbent glass 11.

Instead of the UV/IR cutoff coating layer 21, it would also be acceptable to use a coating layer that has the property of passing UV while only cutting off IR.

While, in the first through fourth embodiments described above, the connection FPCs 18 were disposed along the short sides of the image sensor 12, on its left and right, with the image sensor 12 between them, it would also be acceptable for them to extend along the long sides of the image sensor 12, above and below it, with the image sensor 12 between them. Moreover, while the piezoelectric elements 13 and the connection FPCs 18 were provided in pairs and were arranged on both sides of the image sensor 12, it would also be acceptable to provide them singly, on only one side or the other of the image sensor 12.

While, in the first through fourth embodiments described above, the single lens reflex digital camera 100 was explained as an example of an image capturing device, it would also be acceptable that the camera body 102 itself is considered as an image capturing device.

In the first through fourth embodiments described above, the interchangeable-lens camera was explained as an image capturing device. The concept of the first through fourth embodiments can also be applied to a fixed-lens camera that has a structure integrated with a photographic lens and a camera body.

While, in the first through fourth embodiments described above, the single lens reflex digital camera 100 that has a mirror mechanism (a quick return mirror) was explained as an image capturing device. The concept of the first through fourth embodiments can also be applied to a mirror-less camera that does not include the mirror mechanism (a quick return mirror).

Provided that the essential characteristics of the present invention are preserved, the present invention is not to be considered as being limited by the embodiments described above. Other implementations that may be considered to fall within the scope of the technical concept of the present invention are also included within the range of the present invention.

What is claimed is:

1. An image capturing unit, comprising:
   a glass substrate having a first surface and a second surface on an opposite side to the first surface, with a first wiring pattern being provided upon at least the first surface;
   an image sensor that is electrically connected to the first wiring pattern, and that is mounted upon the first surface of the glass substrate;
   a piezoelectric element that is disposed upon the second surface, and that is electrically connected to the first wiring pattern;
   an infra-red cutoff coating that is provided upon the second surface of the glass substrate and that cuts off infra-red radiation; and
   a ground wiring pattern that is provided upon the second surface of the glass substrate, and that is electrically connected to the infra-red cutoff coating.

2. The image capturing unit according to claim 1, wherein:
   a second wiring pattern is provided upon the second surface of the glass substrate; and
   the piezoelectric element is electrically connected to the second wiring pattern.

3. The image capturing unit according to claim 2, further comprising:
   a through hole that extends through the glass substrate, and that electrically connects the first wiring pattern and the second wiring pattern.

4. The image capturing unit according to claim 3, wherein:
   the image sensor and the piezoelectric element are electrically connected to an outside of the image capturing unit via the first wiring pattern, with a single system for connection.

5. The image capturing unit according to claim 4, further comprising:
   a flexible printed circuit that is disposed upon the first surface, and that is electrically connected to the first wiring pattern via a layer of an anisotropic electrically conductive material.

6. The image capturing unit according to claim 3, wherein:
   the image sensor and the piezoelectric element are electrically connected to an outside of the image capturing unit via the second wiring pattern, with a single system for connection.

7. The image capturing unit according to claim 6, further comprising:
   a flexible printed circuit that is disposed upon the second surface, and that is electrically connected to the second wiring pattern via a layer of an anisotropic electrically conductive material.

8. The image capturing unit according to claim 1, wherein:
   the glass substrate has a property of absorbing infra-red radiation.

9. An image capturing device, comprising:
   the image capturing unit according to claim 1.

10. An image capturing unit, comprising:
    a glass substrate having a first surface and a second surface on an opposite side to the first surface, with a first wiring pattern being provided upon at least the first surface;
    an image sensor that is electrically connected to the first wiring pattern, and that is mounted upon the first surface of the glass substrate;
    a piezoelectric element that is disposed upon the first surface, and that is electrically connected to the first wiring pattern;
    an infra-red cutoff coating that is provided upon the second surface of the glass substrate and that cuts off infra-red radiation; and
    a ground wiring pattern that is provided upon the second surface of the glass substrate, and that is electrically connected to the infra-red cutoff coating.

11. An image capturing device, comprising:
    the image capturing unit according to claim 10.

* * * * *